(12) United States Patent
Moumen et al.

(10) Patent No.: US 10,637,330 B2
(45) Date of Patent: Apr. 28, 2020

(54) METHOD AND APPARATUS FOR REDUCING ELECTROMAGNETIC INTERFERENCE

(71) Applicant: Valeo North America, Inc., Troy, MI (US)

(72) Inventors: Monji Moumen, Seymour, IN (US); David Boudikian, Seymour, IN (US); Youssef Zahi, Seymour, IN (US)

(73) Assignee: Valeo North America, Inc., Troy, MI (US)

( * ) Notice: Subject to any disclaimer, the term of this patent is extended or adjusted under 35 U.S.C. 154(b) by 0 days.

(21) Appl. No.: 15/803,264

(22) Filed: Nov. 3, 2017

(65) Prior Publication Data

US 2019/0140522 A1 May 9, 2019

(51) Int. Cl.

| H02K 11/02 | (2016.01) |
|---|---|
| H02M 3/335 | (2006.01) |
| H05K 9/00 | (2006.01) |
| H05K 1/02 | (2006.01) |
| G01R 31/00 | (2006.01) |
| G01R 31/382 | (2019.01) |
| B60Q 11/00 | (2006.01) |
| H02M 1/00 | (2006.01) |

(52) U.S. Cl.
CPC .......... *H02K 11/02* (2013.01); *G01R 31/002* (2013.01); *G01R 31/382* (2019.01); *H02M 3/33507* (2013.01); *H05K 1/0231* (2013.01); *H05K 1/0233* (2013.01); *H05K 9/0083* (2013.01); *B60Q 11/007* (2013.01); *H02M 2001/0025* (2013.01)

(58) Field of Classification Search
CPC ..................................................... H02M 3/335
See application file for complete search history.

(56) References Cited

U.S. PATENT DOCUMENTS

| 10,044,257 | B1* | 8/2018 | Hezar | H02M 3/156 |
|---|---|---|---|---|
| 2011/0019446 | A1* | 1/2011 | Wu | H02M 3/33523 363/79 |
| 2013/0057245 | A1* | 3/2013 | Hirotsu | H02M 7/53803 323/312 |
| 2013/0100715 | A1 | 4/2013 | Lin et al. | |
| 2014/0361687 | A1* | 12/2014 | Olson | B60Q 1/44 315/80 |
| 2015/0381030 | A1* | 12/2015 | Endo | H02H 9/08 363/50 |
| 2018/0007751 | A1* | 1/2018 | Gritti | H02M 1/08 |
| 2018/0123442 | A1* | 5/2018 | Vangala | H02M 1/083 |

* cited by examiner

*Primary Examiner* — Daniel Kessie
*Assistant Examiner* — Trinh Q Dang
(74) *Attorney, Agent, or Firm* — Oblon, McClelland, Maier & Neustadt, L.L.P.

(57) ABSTRACT

A vehicle light assembly, a system, and a method for reducing electromagnetic interference are provided. The vehicle light assembly includes a light source, DC-DC conversion circuitry including a switch, and a microcontroller. The microcontroller is configured to generate a reference voltage, the reference voltage being changed periodically within a predetermined range, and drive the switch associated with the DC-DC conversion circuitry with a signal based on at least the reference voltage.

12 Claims, 9 Drawing Sheets

METHOD AND APPARATUS FOR REDUCING ELECTROMAGNETIC INTERFERENCE

BACKGROUND

DC-DC conversion systems convert an input DC voltage to a predetermined output voltage. Parasitic capacitance and parasitic inductance usually exist in a switching mode in DC-DC conversion systems. Electromagnetic interference (EMI) generated by DC-DC conversion systems may need to be reduced in order to comply with EMI limits and to reduce interference with other components. Accordingly, what is needed, as recognized by the present inventors, is a method to minimize EMI in DC-DC conversion systems.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

SUMMARY

The present disclosure relates to a vehicle light assembly. The vehicle light assembly includes a light source coupled to DC-DC conversion circuitry, the DC-DC conversion circuitry including a switch, and a microcontroller. The microcontroller is configured to generate a reference voltage, the reference voltage being changed periodically within a predetermined range, and drive the switch associated with the DC-DC conversion circuitry with a signal based on at least the reference voltage.

In one embodiment, the microcontroller is further configured to change the reference voltage from a minimum value to a maximum value in a predetermined number of steps, and change the reference voltage from the maximum value to the minimum value in a second predetermined number of steps.

In one embodiment, the DC-DC conversion circuitry generates a jitter around a main switching frequency due to the change in the reference voltage.

In one embodiment, the predetermined number of steps is selected as a function of a noise threshold.

In one embodiment, the predetermined number of steps and the second predetermined number of steps are equal.

In one embodiment, the predetermined number of steps is five.

In one embodiment, the light source is a light emitting diode.

In one embodiment, the switch is a metal-oxide-semiconductor field effect transistor (MOSFET).

An aspect of the present disclosure includes a system for reducing electromagnetic interference. The system includes a DC-DC conversion circuit and a controller. The controller is configured to generate a reference voltage, the reference voltage being changed periodically within a predetermined range, and drive a switch associated with a DC-DC conversion circuit with a signal based on at least the reference voltage.

An aspect of the present disclosure includes a method for reducing electromagnetic interference. The method includes generating a reference voltage, the reference voltage being changed periodically within a predetermined range, and driving a switch associated with a DC-DC conversion circuitry with a signal based on at least the reference voltage.

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
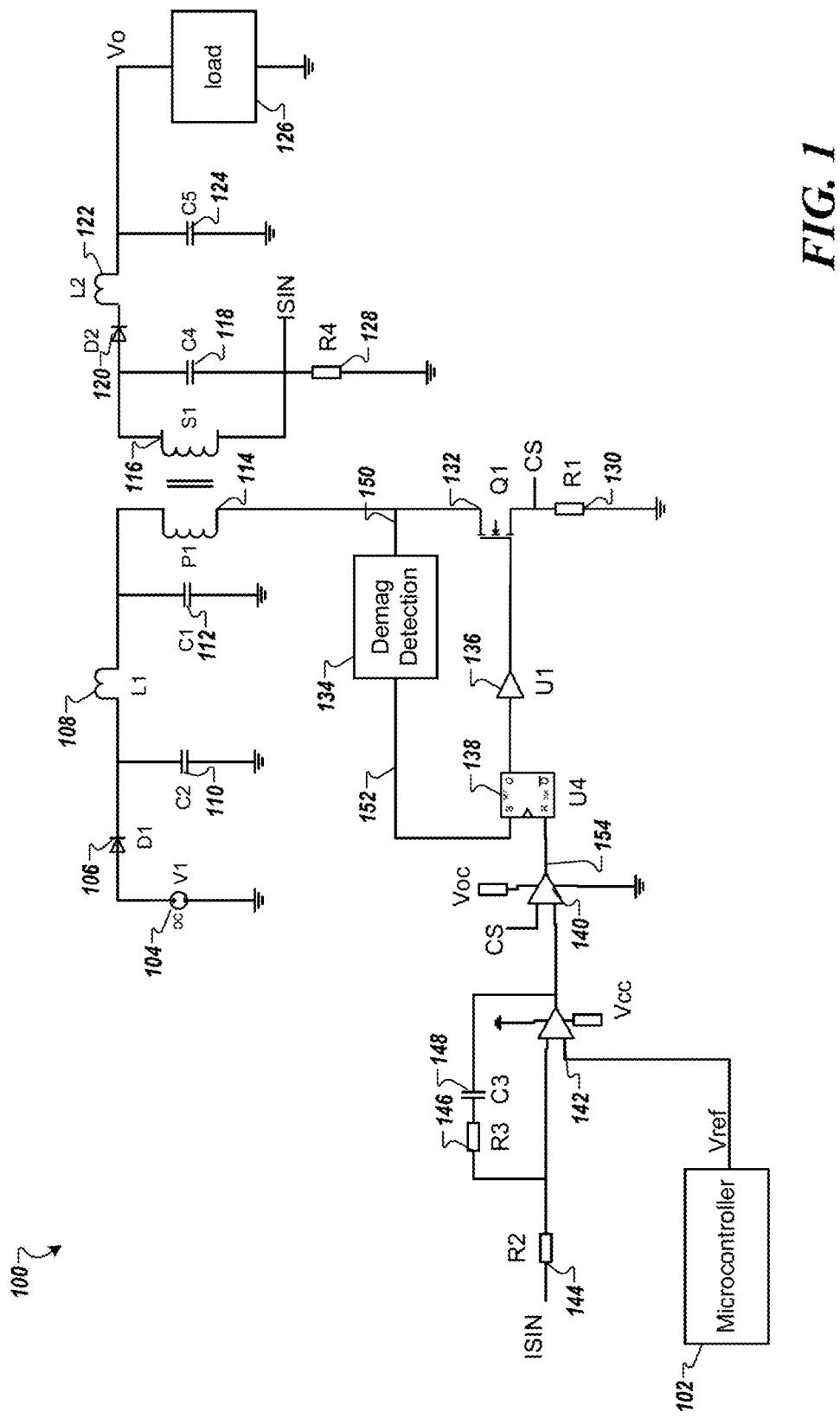
FIG. 1 is a diagram that shows a DC-DC conversion system according to one example.

Referring now to the drawings, wherein like reference numerals designate identical or corresponding parts throughout several views, the following description relates to a method and a circuit for reducing electromagnetic interference (EMI) using switching frequency jittering in a quasi-resonant mode. The method described herein reduces electromagnetic compatibility (EMC noise on a drive circuit for a light source included in a vehicle light module.

FIG. 1 is a schematic that shows a DC-DC conversion system 100 according to one example. In one implementation the DC to DC converter may be a quasi resonant flyback converter. The DC-DC conversion system 100 lowers or boosts the voltage of the electricity supplied from a battery (corresponds to input voltage 104) and supply the electricity to a load 126.

The system 100 includes a primary winding 114 and a secondary winding 116. A first side of the system 100 includes a voltage source 104, a rectifying diode 106, a first capacitor 112, a second capacitor 110, a third capacitor 148, an inductor 108, a demagnetization detection component 134, a flip flop 138, a buffer 136, a switch 132, a first comparator 140, a second comparator 142, a first resistor 130, a second resistor 144, a third resistor 146, and a microcontroller 102.

A secondary side of the transformer includes a second rectifying diode 120, a second inductor 122 in series with the second rectifying diode 120, a fourth capacitor 118, a fifth capacitor 124, and a fourth resistor 128.

The microcontroller 102 is coupled to a first input terminal of the second comparator 142. A second input terminal of the second comparator 142 is connected via the second resistor 144 to node ISIN. The output terminal of the second comparator 142 is connected via a feedback loop that includes the third resistor 146 coupled in series with the third capacitor 148 to the second input terminal of the second comparator 142. Further, the output terminal of the second comparator 142 is connected to a first input terminal of the first comparator 140. A second input terminal of the first comparator 140 is coupled to node CS. The first comparator 140 outputs a comparison signal 154.

The demagnetization detection component 134 receives a demagnetization signal 150 and outputs a detection signal 152. The flip-flop 138 receives the comparison signal 154 at one input terminal and the detection signal 152 at another input terminal. In response, the flip-flop 138 outputs a signal 154 to the buffer 136 to drive the switch 132. The switch 132 is a field-effect transistor (FET) (e.g., a metal-oxide-semiconductor FET), a bipolar junction transistor (BJT), or an insulated-gate bipolar transistor (IGBT). The load 126 may be connected at terminal Vo. The load 126 may be a vehicle light such as a full beam light, a fog light, a tail lamp, a stop lamp, or the like.

The switching frequency of the system 100 may be determined based on the following equation:

$$F = \frac{\eta}{2 \times L_p \times P_{out}} \times \left( \frac{N \times (V_o + V_f)}{1 + \frac{N(V_o + V_f)}{V_{in}}} \right)^2 \quad (1)$$

where F represents the switching frequency, $L_p$ represents the inductance of the primary winding 114, $P_{out}$ represents the output power of the system 100, N represents a turns ratio between the primary winding 114 and the secondary winding 116, η represents the power transfer efficiency, $V_o$ represents the output voltage on the secondary side of the system 100, $V_f$ represents the voltage drop of the rectifying diode 120, $V_{in}$ represents the voltage level of the input voltage after the diode 106.

Figure 3A:
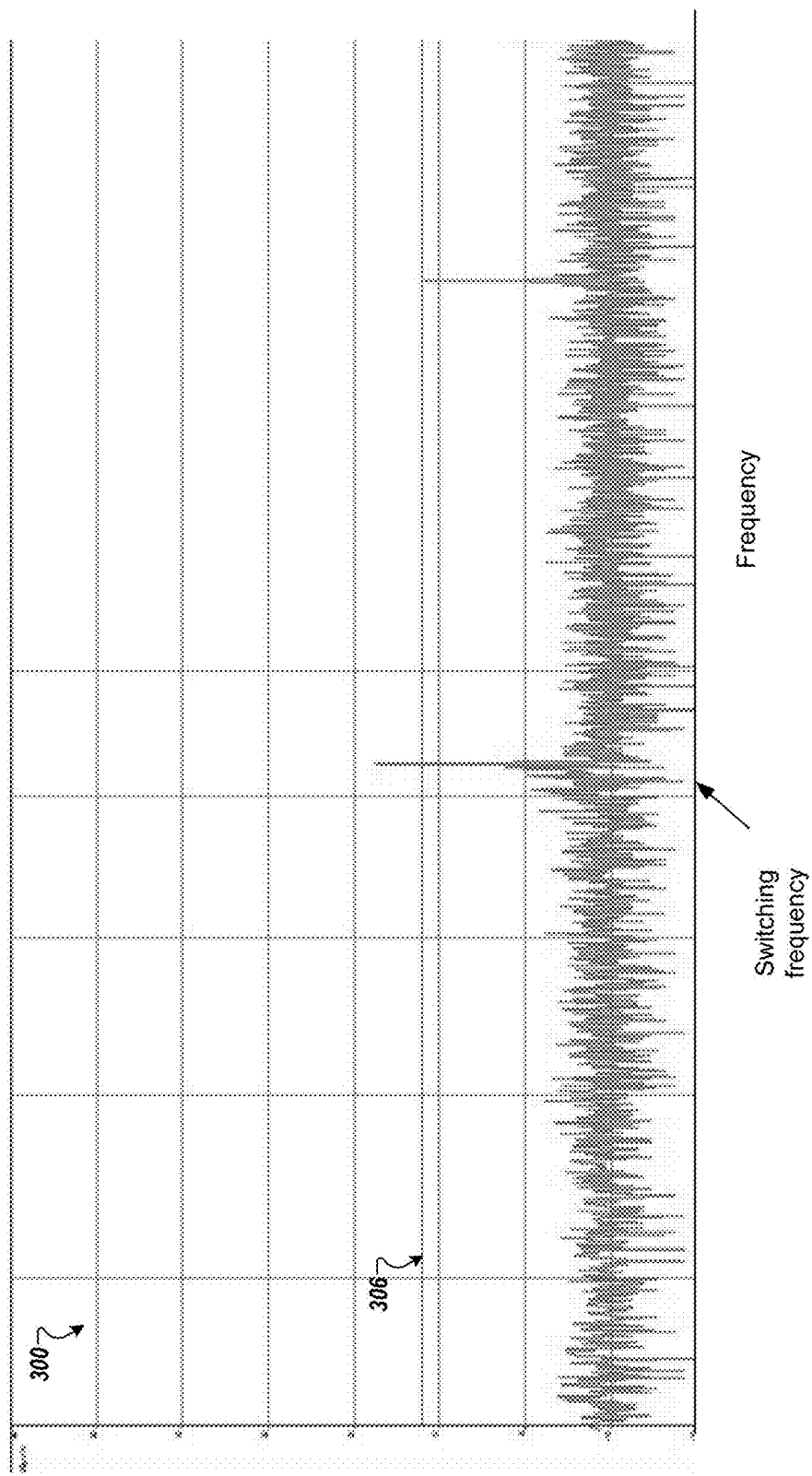
FIG. 3A is a schematic that shows radiated emission output noise according to one example.

The noise may appear at the switching frequency (e.g., as shown in FIG. 3A). Varying the switching frequency over time may disperse the noise. In other words, creating a jitter at the switching frequency reduces the EMI at the switching frequency. For example, the main switching frequency may be equal to one Megahertz (MHz). The switching frequency may be changed within a predetermined range around the main switching frequency, for example, by steps of ±200 Hertz (Hz). In one implementation, the jitter at the switching frequency is created by varying a reference voltage at the input terminal of the second comparator 142 which in turn varies the output current at the load.

The microcontroller 102 is configured to create incremental and decremental steps of voltage around a nominal value of the reference voltage in order to create the jitter at the switching frequency. The microcontroller 102 may provide five steps of voltage around the nominal value which correspond to five steps of current around a nominal of the output current. The average reference voltage is constant therefore the average output current is also constant. In one implementation, the reference voltage provided by the microcontroller 102 can be controlled by software and/or hardware.

The input voltage 104 may be from the battery associated with the vehicle. The battery may have an output voltage of 12 volts (V). The output voltage may be based on the application. For example, the output voltage may be of the light source connected to the converter such as a light emitting diode (LED). Although the power delivered to the load is variable over time, the flux is constant since the change in the power is minimal. Thus, there is no change in the aesthetic and function of the vehicle light.

The number of steps in the voltage corresponds to the change in the frequencies which in turn corresponds to the spread in the noise spectrum. The number of steps may be based on a noise threshold associated with an application of the DC-DC conversion system 100. A higher number of steps around the nominal value correspond to lower noise at the main switching frequency. Thus, the predetermined range and the predefined number of steps may be selected such as the EMI associated with the system 100 complies with regulatory requirements. Further, the microcontroller 102 may be reconfigured based on an updated noise threshold without changing other elements in the DC-DC conversion system 100. The predetermined range and the predefined number of steps may be modified to satisfy the updated noise threshold. Further, the regulatory requirements may vary by customer, by agency, or by country settings of the microcontroller 102 may be varied to satisfy the regulatory requirement without modifying the design.

Figure 2A:
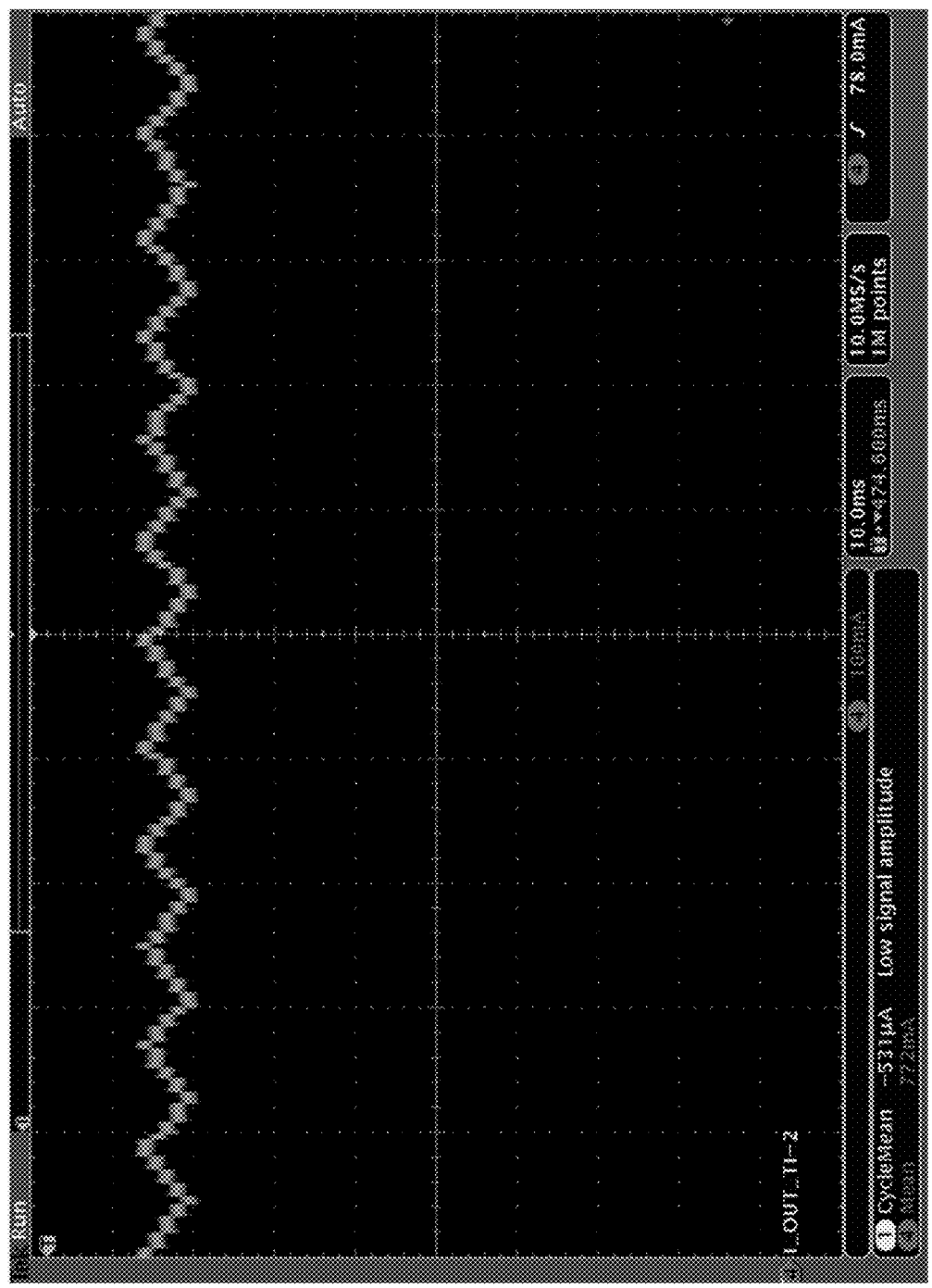
FIGS. 2A-2C are schematics that show output current waveforms of the DC-DC conversion system according to one example.
Figure 2B:
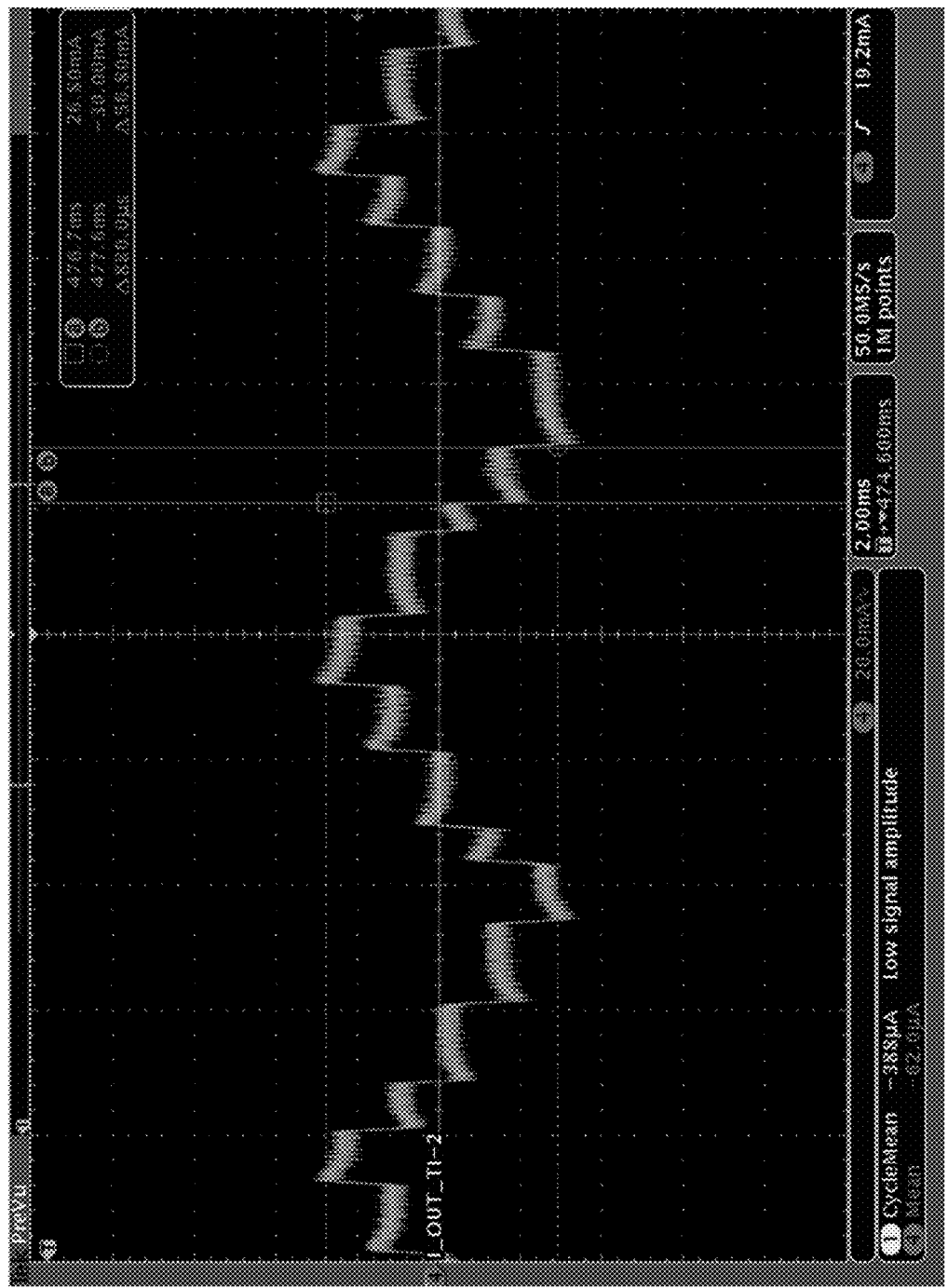
Figure 2C:
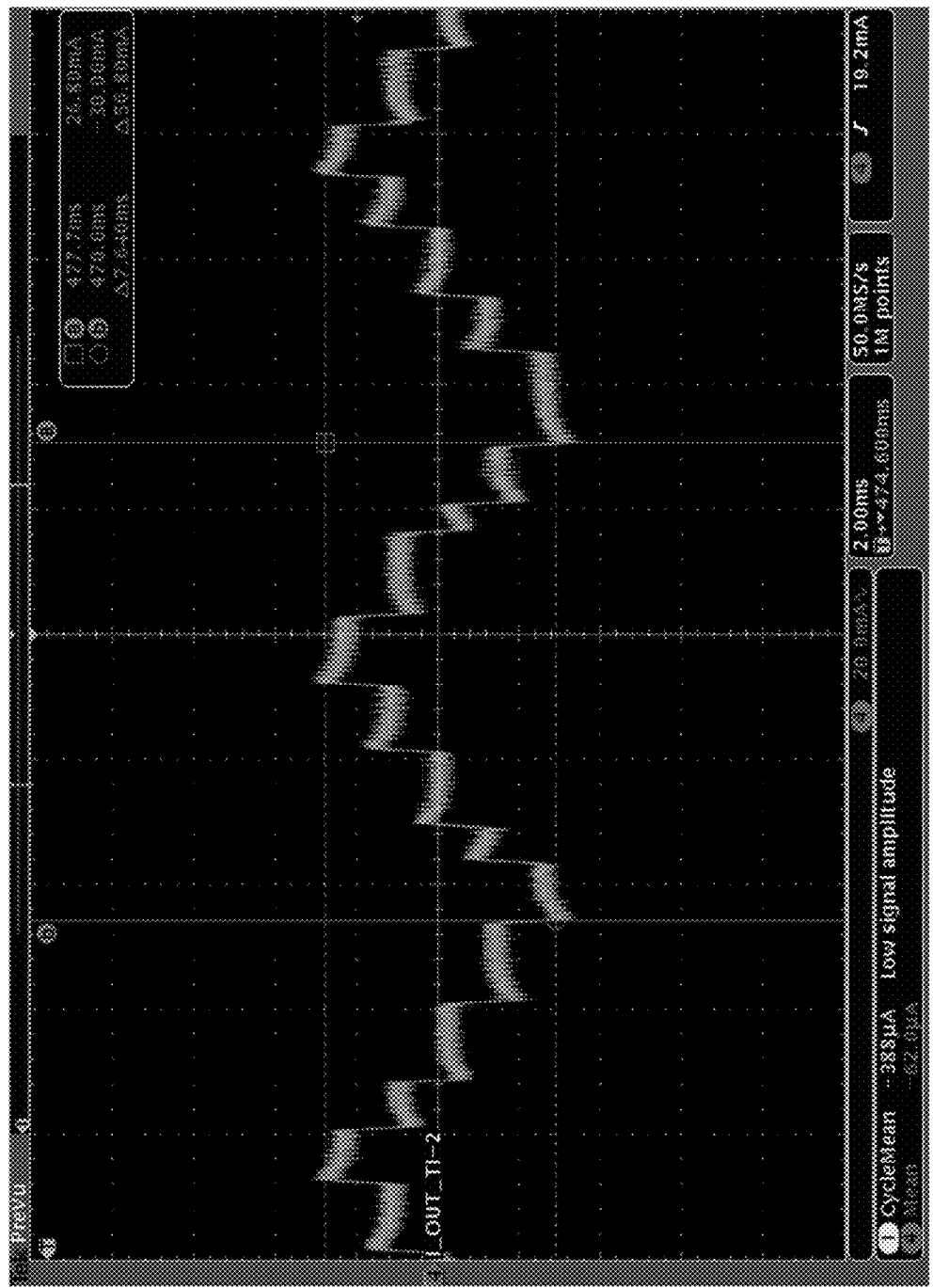

FIG. 2A is a schematic 200 that shows the output current at node $V_o$ according to one example. Magnified views are shown in FIGS. 2B and 2C. The time steps depend on customer requirement based on equipment and device settings. In one implementation, each time step may be approximately around 1 millisecond (ms). The period may be 8 ms. Schematic 200 shows five current steps around the nominal value of 750 milliampere (mA).

Figure 3B:
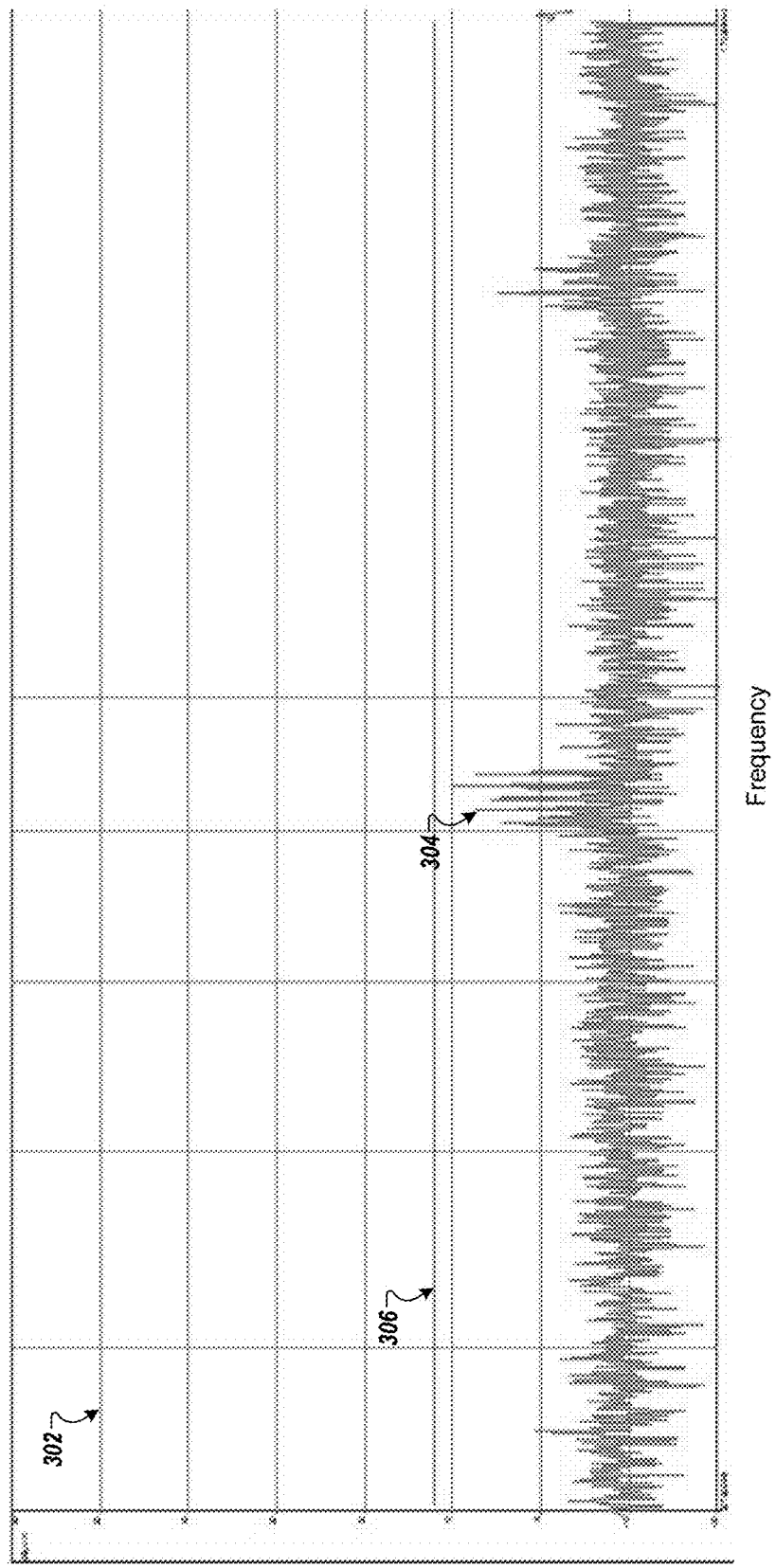
FIG. 3B is a schematic that shows the radiated emission output noise of the DC-DC conversion system according to one example.

FIG. 3A is a schematic 300 that shows a radiated emission output noise for a constant reference voltage. The noise shows a peak at the switching frequency and its harmonics. The noise threshold is indicated by 306. FIG. 3B is a schematic 302 that shows the output noise for the DC-DC conversion system described herein for the output current shown in FIGS. 2A-2C. As indicated by 304 the noise is reduced below the noise threshold. The noise shows multiple peaks each having a value below the noise threshold. The number of peaks corresponds to the number of steps in the output current. In the example shown, the noise is reduced by 10 dBuV/m without additional components.

Figure 4:
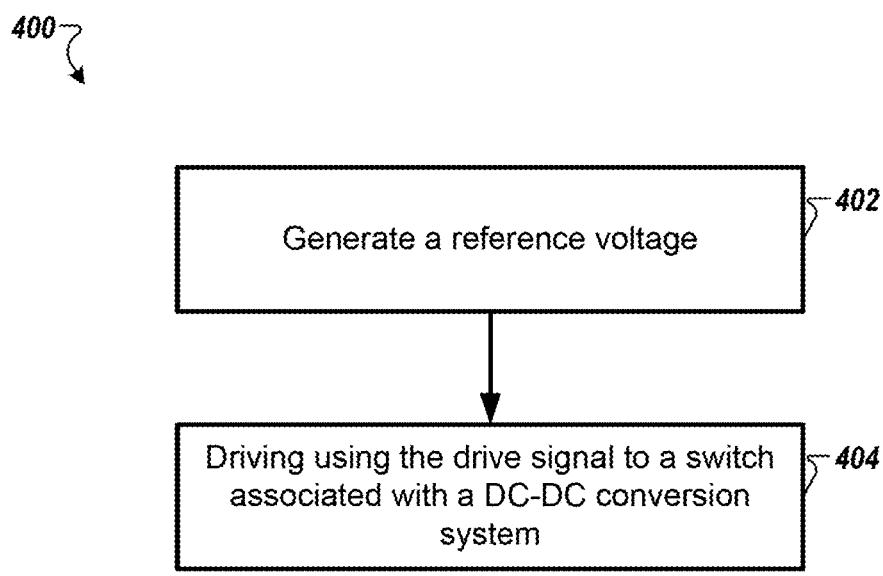
FIG. 4 is a flowchart that shows a method for reducing electromagnetic interference according to one example.

FIG. 4 is a flowchart that shows a method 400 for reducing electromagnetic interference according to one example.

Figure 6:
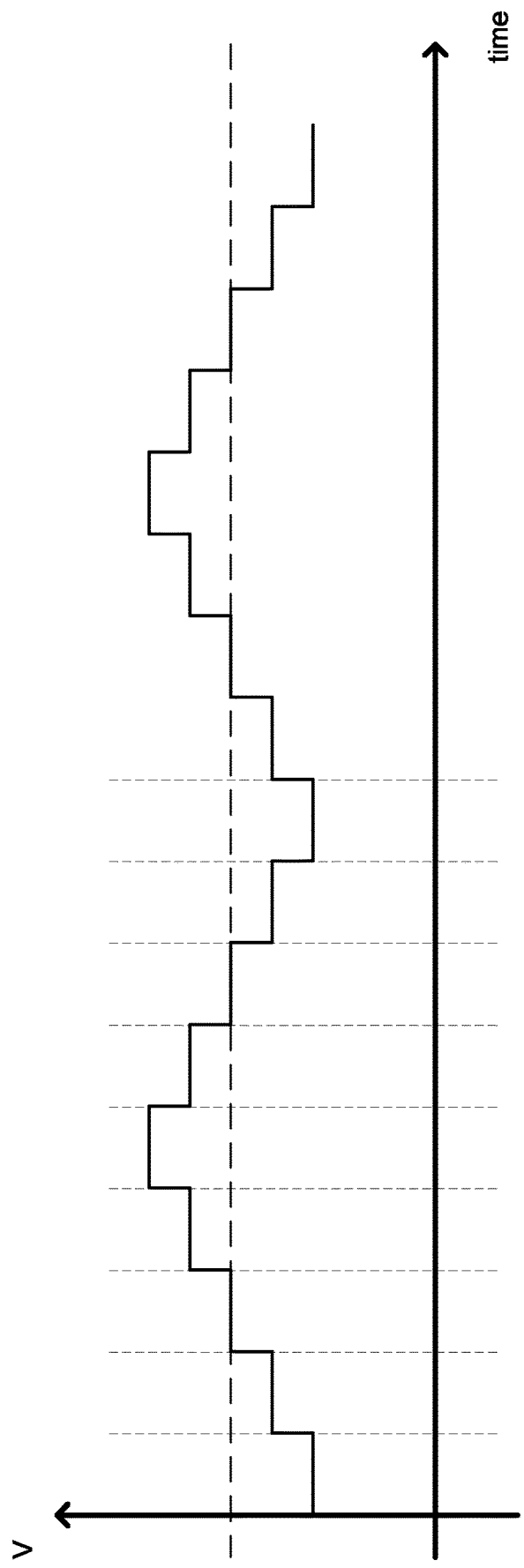
FIG. 6 is a diagram of a reference voltage signal.

At step 402, the microcontroller 102 may generate a reference voltage. The reference voltage is changed periodically. The switching frequency of the DC-DC converter is configured to change in response to the change in the reference voltage. The voltage is changed from a minimum value to a maximum value in a predetermined number of steps. The voltage is then changed from the maximum value to the minimum value in a second predetermined number of steps. In one implementation, the second predetermined number and the predetermined number may be equal. An example of the reference voltage with 4 steps is shown in FIG. 6.

At step 404, a drive signal based on the reference voltage is provided to a switch associated with the DC-DC converter. The output current of the DC-DC conversion system is used to drive the load such as one or more LEDs.

In one implementation, an association between the nominal value, the predetermined range around the nominal value, and the predetermined number of steps and the noise threshold may be stored in a look-up table. For example, the settings of the microcontroller may be retrieved based on a noise threshold inputted.

A system which includes the features in the foregoing description provides numerous advantages. In particular, the methodologies described herein solve the EMC issue on conductive and radiated emission test during design validation (DV) tests for a vehicle light.

Figure 5:
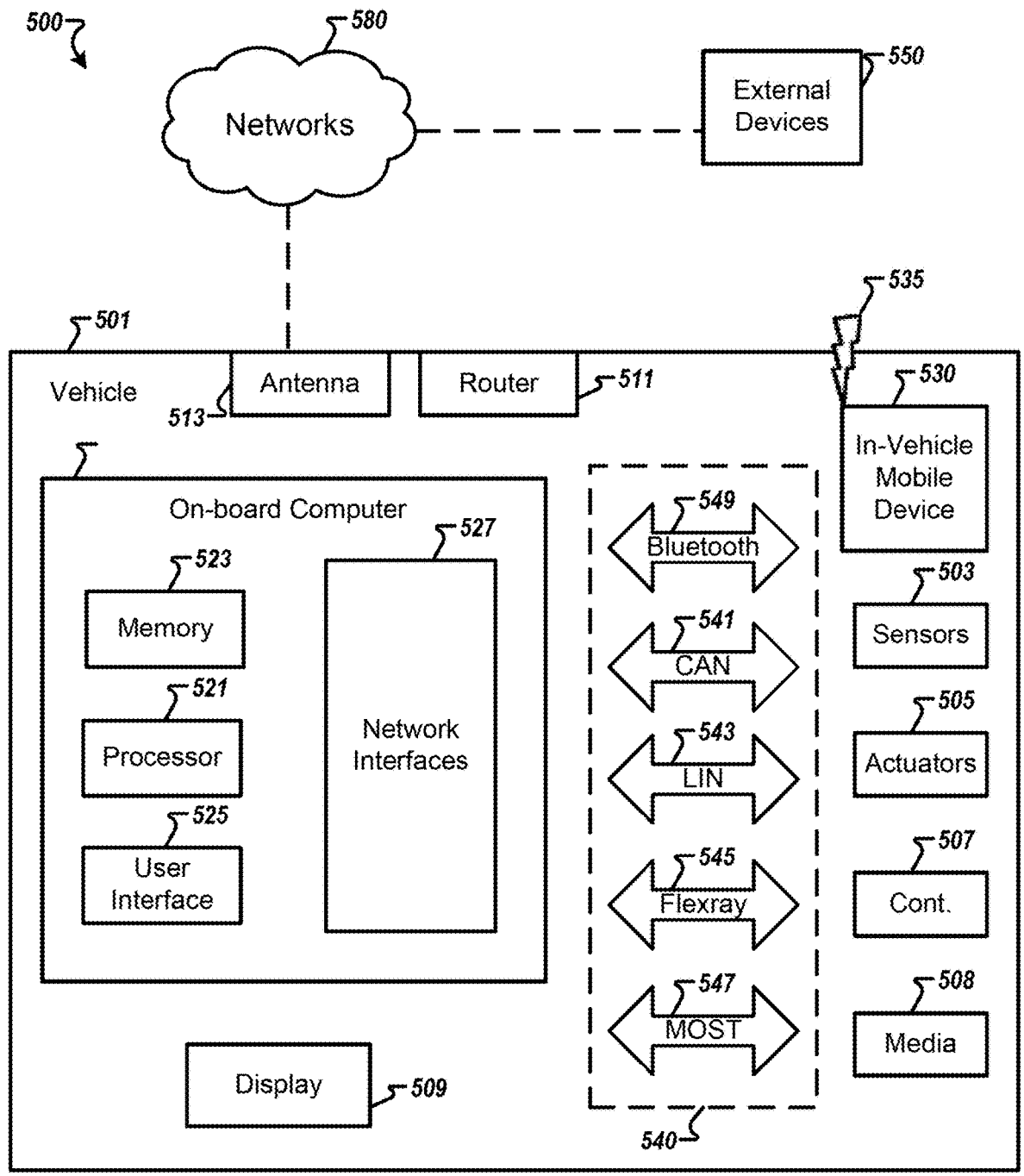
FIG. 5 is a block diagram of a vehicle environment in which embodiments of the invention disclosed herein may be implemented.

FIG. 5 is a simplified block diagram of a vehicle environment 500 in which embodiments of the invention disclosed herein may be implemented. The vehicle environment 500 includes a vehicle 501 in communication with one or more external devices 550 by way of one or more external networks 580. Vehicle 501 also includes various internal networks 540 for interconnecting several vehicle devices within the vehicle as will be discussed below. The vehicle environment 500 may also include one or more in-vehicle mobile device 530. External devices 550 include any device located outside the vehicle 501 such that the external device must communicate with the vehicle and its devices by an external network 580. For example, the external devices may include mobile devices, electronic devices in networked systems (e.g., servers or clients in a local area network (LAN), etc.), on board computers of other vehicles etc. In-vehicle mobile devices 530 are devices which are located within, or in the vicinity of the vehicle 501 such that the in-vehicle mobile device can communicate directly with internal networks 540 of the vehicle 501. In-vehicle mobile devices 530 may also connect with external networks 580.

Vehicle 501 includes vehicle devices integral with or otherwise associated with the vehicle 501. In the embodiment of FIG. 5, vehicle devices include one or more sensors 503, one or more actuators 505, one or more control units 507, one or more media systems 508, one or more displays 509, one or more routers 511, one or more antenna 513, and one or more on board computers 520. The one or more on board computers may generate signals having a desired duty factor to control one or more vehicle lights. As used herein, the term "vehicle device" is meant to encompass sensors, actuators, controllers, electronic control units (ECUs), detectors, instruments, embedded devices, media devices including speakers, a CD and/or DVD player, a radio, vehicle navigation systems (e.g., GPS) displays, other peripheral or auxiliary devices or components associated with the vehicle 501.

Sensors 503 detect various conditions within (or in the immediate vicinity of) the vehicle 501. For example, sensors 503 may be temperature sensors, photosensors, position sensors, speed sensors, angle sensors or any other sensor for detecting a diagnostic condition or other parameter of the vehicle 501 or its ambient environment. Sensors 503 may be passive or "dumb" sensors that provide an analog representative of the sensed parameter, or so called "smart" sensors with integrated memory and digital processing capability to analyze the parameter sensed within the sensor itself. Actuators 505 cause motion of some mechanical element of the vehicle in response to a control signal. For example, actuators 505 may be hydraulic actuators, pneumatic actuators or electrical/electronic actuators such as a stepper motor. Actuators 505 may be used to move vehicle lighting devices to implement intelligent light, for example.

Actuators 505 may also be "dumb" devices that react to a simple analog voltage input, or "smart" devices with built-in memory and processing capability. Actuators 505 may be activated based on a sensed parameter from sensors 503, and one such sensed parameter may be a physical position of the actuator 505 itself. Thus, the sensors 503 and actuators 505 may be connected in a feedback control loop for diagnostic detection and control of the vehicle 501.

On-board computer 520 is a vehicle device for providing general purpose computing functionality within the vehicle 501. The on-board computer 520 typically handles computationally intensive functions based on software applications or "apps" loaded into memory. On-board computer 520 may also provide a common interface for different communication networks in the vehicle environment 500. On-board computer 520 includes one or more processor 521, one or more memory 523, one or more user interface 525 (e.g., the operator interface described previously herein), and one or more network interface 527.

In example embodiments, the operations for controlling the system 100 may be implemented by logic encoded in one or more tangible media, which may be inclusive of non-transitory media (e.g., embedded logic provided in an ASIC, digital signal processor (DSP) instructions, software potentially inclusive of object code and source code to be executed by a processor or other similar vehicle device, etc.).

Multiple internal vehicle networks represented by 540 may exist in the vehicle 501 to provide communication pathways to various vehicle devices distributed throughout the vehicle 501. An internal vehicle network 540 is a collection of nodes, such as vehicle devices, integrated with or otherwise linked to the vehicle and interconnected by communication means. Vehicle networks 540 typically include hard wired bus type networks, each providing communication pathways to particular vehicle devices distributed throughout a vehicle. FIG. 5 shows four examples of such hard wired networks: Controller Area Network (CAN) 541, Local Internet Network (LIN) 543, Flexray bus 545, and Media Oriented System Transport (MOST) network 547.

Other hard wired internal networks such as Ethernet may be used to interconnect vehicle devices in the vehicle 501. Further, internal wireless networks 549, such as near field communications, Bluetooth, etc. may interconnect vehicle devices.

Users (driver or passenger) may initiate communication in vehicle environment 500 via some network, and such communication may be initiated through any suitable device such as, in-vehicle mobile device 530, display 509, user interface 525, or external devices 550.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A vehicle light assembly, comprising:
    a battery;
    a light source coupled to DC-DC conversion circuitry;
    the DC-DC conversion circuitry including a switch;
    a microcontroller configured to
        generate a reference voltage, the reference voltage being changed periodically above and below a nominal voltage, and drive the switch associated with the DC-DC conversion circuitry with a signal based on at least the reference voltage; and a flip flop receiving a signal generated using the reference voltage and outputting the signal based on at least the reference voltage to drive the switch, wherein the microcontroller is further configured to change the reference voltage stepwise by a first plurality of steps from the nominal voltage to a maximum voltage and by a second plurality of steps from the nominal voltage to a minimum voltage, an output current of the DC-DC conversion circuitry varies based upon the change in the reference voltage, the reference voltage is changed based upon a noise threshold, and the DC-DC conversion circuitry is configured to lower or increase a first voltage of supplied from the battery to a second voltage associated with the light source.

2. The vehicle light assembly of claim 1, wherein the light source is a light emitting diode.

3. The vehicle light assembly of claim 1, wherein the switch is a metal-oxide-semiconductor field effect transistor (MOSFET).

4. The vehicle light assembly of claim 1, wherein:
the DC-DC conversion circuitry comprises a primary winding and a secondary winding;
the light is connected to the secondary winding; and
the switch is connected to one side of the primary winding.

5. A system for reducing electromagnetic interference, comprising:
a DC-DC conversion circuitry; and
a controller configured to
generate a reference voltage, the reference voltage being changed stepwise above and below a nominal voltage by a first plurality of steps from the nominal voltage to a maximum voltage and by a second plurality of steps from the nominal voltage to a minimum voltage, and
drive a switch associated with the DC-DC conversion circuitry with a signal based on at least the reference voltage.

6. The system of claim 5, wherein the reference voltage is changed based upon a noise threshold.

7. The system of claim 5, wherein an output current of the DC-DC conversion circuitry varies based upon the change in the reference voltage.

8. The system of claim 5, wherein the switch is a metal-oxide-semiconductor field effect transistor (MOSFET).

9. A method for reducing electromagnetic interference, the method comprising:
generating a reference voltage using a controller, the reference voltage being changed stepwise above and below a nominal voltage by a first plurality of steps from the nominal voltage to a maximum voltage and by a second plurality of steps from the nominal voltage to a minimum voltage; and
using the controller to drive a switch associated with a DC-DC conversion circuitry with a signal based on at least the reference voltage.

10. The method of claim 9, further comprising: changing the reference voltage based on a noise threshold.

11. The method of claim 9, further comprising:
varying an output current of the DC-DC conversion circuitry due to the change in the reference voltage.

12. The method of claim 9, wherein the switch is a metal-oxide-semiconductor field effect transistor (MOSFET).

* * * * *